United States Patent [19]
D'Errico

[11] 3,870,962
[45] Mar. 11, 1975

[54] MEANS TO CONTROL PULSE WIDTH AND REPETITION RATE OF BINARY COUNTER MEANS

[75] Inventor: John J. D'Errico, San Diego, Calif.

[73] Assignee: Solitron Devices, Inc., Tappan, N.Y.

[22] Filed: Apr. 25, 1973

[21] Appl. No.: 354,388

[52] U.S. Cl. .................... 328/58, 307/208, 307/234, 307/265, 307/269, 307/271
[51] Int. Cl. .......................... H03k 5/04, H03k 1/10
[58] Field of Search ........... 307/208, 234, 265, 269, 307/271, 293; 328/58, 111–112, 129

[56] References Cited

UNITED STATES PATENTS

| | | | |
|---|---|---|---|
| 3,097,340 | 7/1963 | Dobbie | 307/265 |
| 3,454,884 | 7/1969 | Ziehm | 307/265 |
| 3,504,200 | 3/1970 | Avellar | 307/265 |
| 3,566,280 | 2/1971 | Emmons et al. | 307/269 |
| 3,611,158 | 10/1971 | Strathman | 307/234 |
| 3,667,054 | 5/1972 | Nelson | 328/111 |
| 3,755,748 | 8/1973 | Carlow et al. | 307/269 |

OTHER PUBLICATIONS

"Electrical Filter" by Burke et al., IBM Tech. Disclosure Bulletin, Vol. 12, No. 9, Feb. 1970, pp 1369–1370

*Primary Examiner*—Stanley D. Miller, Jr.
*Attorney, Agent, or Firm*—Richard G. Geib

[57] ABSTRACT

A CMOS circuit including a first gate, a shift register, a second gate, an electronic switch and a latch circuit operatively related therein such that pulse width and the repetition rate thereof from the shift register to the second gate is equated, respectively, to a period of input signals to the shift register and the frequency of the input signal to the first gate, said circuit also including electronic means to provide clock signals and counter means signals, respectively being the input signals aforesaid, said circuit being adaptable to employ a third gate operatively related to said latch to set same in accordance with said counter means signals and another input signal means.

8 Claims, 1 Drawing Figure

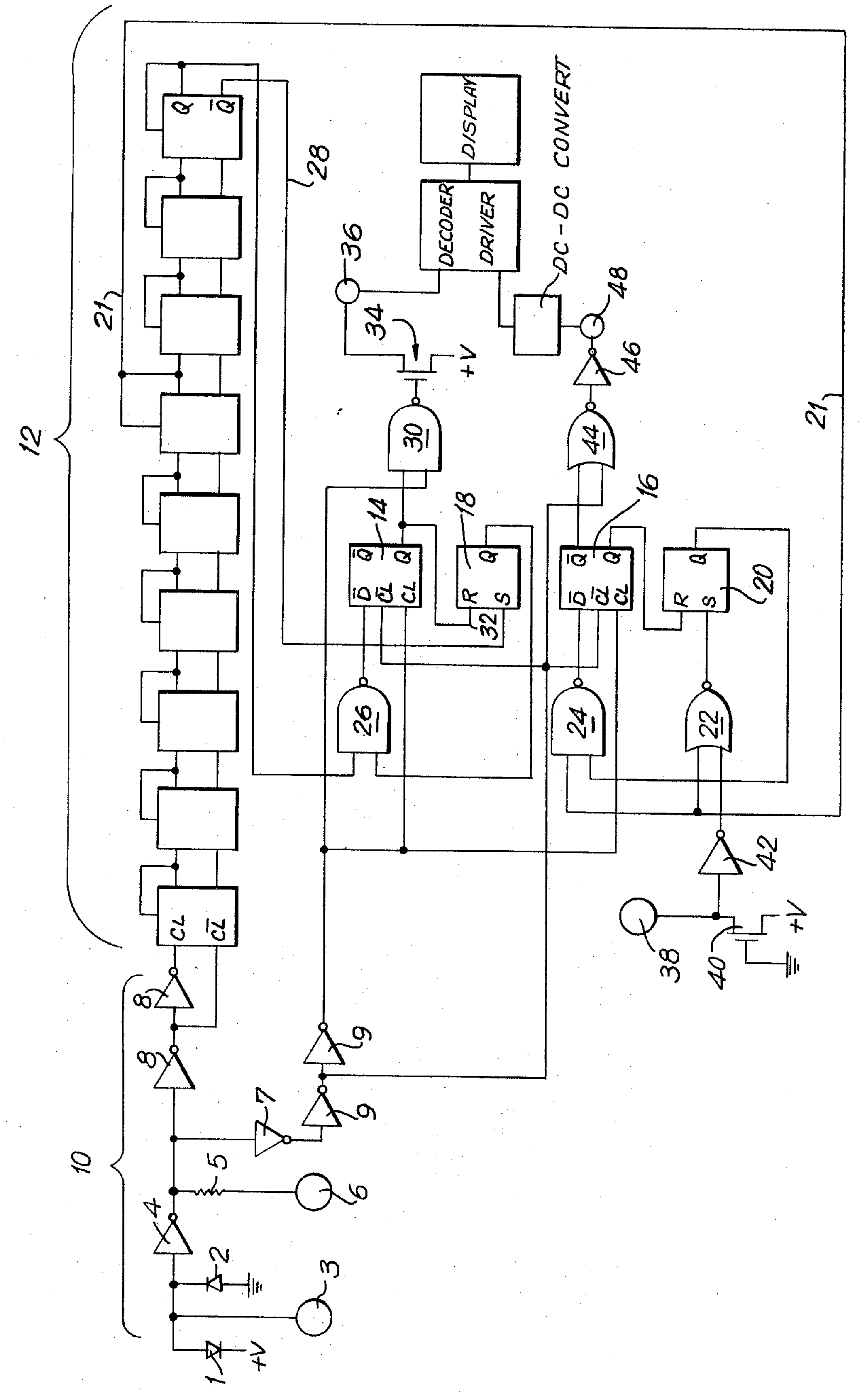
DISPLAY
DECODER DRIVER
DC-DC CONVERT
+V

MEANS TO CONTROL PULSE WIDTH AND REPETITION RATE OF BINARY COUNTER MEANS

BACKGROUND OF INVENTION

One of the prime considerations involved in designing a practical portable electronic circuit is low power dissipation. Such circuits have contributed to the recent marketing of electronic watches; i.e. watches having no mechanical movements. Such watches have been possible with the emergence of practical CMOS technology in miniaturizing and consolidating on a single chip a shaping circuit providing a connection between an electronic oscillator and an electronic multistage binary counter. In such CMOS circuits the power required in the binary counter is a function of the frequency with which each stage of the counter switches state. Each stage of the binary counter or divider, as it may be termed, produces one output pulse for every two triggering pulses thereto, as from a shaping circuit. This is so because two trigger pulses cause the binary to shift from one stable state to the other and then back to the first state again. Therefore, a series of cascaded binary counter circuits divides, or scales down, the input pulse rate by a factor depending on the number of stages.

SUMMARY OF INVENTION

It has been found that even with such CMOS circuits there is power dissipastion that causes problems in obtaining predictable service. This has been found to be attributable to pulse distortions that make it possible to have varying width and repetition rate. It is, therefore, a principle purpose and object of this invention to provide with such CMOS circuits means to control the pulse from the binary counter means to a precise width.

A further object of this invention is to provide in such means a reference of clock signals from the shaping circuit so as to control pulse repetition rate such that its timing is precise with respect to such signals.

DETAILED DESCRIPTION

More specifically, with reference to the drawing, there is shown a power supply means connected by diodes 1 and 2 across an oscillator input 3 to an amplifier 4 for the signal from the oscillator. The amplifier 4 output is connected to a resistor 5 connected to an oscillator output 6; to an inverter 7; and to inverting pulse shaper amplifiers 8 and via inverter 7 to inverting pulse shaper amplifiers 9. To those skilled in the art this is the part of the circuit forming a frequency standard means 10 providing frequency standard clock signals CL and $\overline{CL}$.

The clock signals from the pulse shaper amplifier means 8 are provided to the first stage of a binary counter means 12; whereas the clock signals from pulse shaper amplifiers 9 are provided to shift registers 14 and 16. From the last stage of the binary counter 12 an output frequency, for example 64 Hz, is provided to gate 26, whereas a lead 28 connects this last stage to latch 18 also. Therefore, outputs Q and $\overline{Q}$ are used to control gate 26 and set latch 18, respectively.

When latch 18 is set by Q it delivers a frequency to gate 26 that enables it to pass the frequency to shift register 14. The clock signals CL, $\overline{CL}$ to the shift register 14 control the shifting of the input from gate 26 to the output Q thereof. Output Q from shift register 14 is directed to gate 30 and to reset input 32 of latch 18. In gate 30 the output Q of shift register 14 is coupled to the clock signal CL such that an output of gate 30 is half of pulse width of the input and of the right polarity to give a low going signal to drive an open ended switch 34. In latch 18 the output Q of shift register 14 is used to reset the latch thereby disabling gate 26 to provide a pulse width equal to the period of the clock. The frequency output of gate 26 is equal to that from the last stage of the binary counter means 12. The frequency of gate 26 is also the frequency of the Q of shift register 14. This then enables and disables gate 30 at a frequency whereby transistor 34 is maintained the same as that frequency. It may thus be realized that the timing of the pulses at pin 36 are precisely oriented to the clock signals and power dissipation is thereby minimized.

The binary counter means has a lead 21 from an intermediate stage thereof to provide a higher frequency signal, for example 512 Hz, for gates 22 and 24. The gate 22 is for controlling signals from an asychronous source 38 and transistor 40 and a pulse shaper amplifier 42 forming a detctor circuit. Gate 24 provides similar operation as gate 26. Gate 22 provides a signal to set latch 20 in comparison with the frequency provided to gate 22 from the intermediate stage of binary counter means 12. It should be noted that latch 20 can only be set if amplifier 42 is low indicating a one logic state of the detector. If the detector is in the opposite logic state 42 will be high and latch 20 could not be set. Latch 20 when set provides a signal to enable gate 24 and allow the frequency to be passed to shift register 16 input D. As with the shift register 14 the clock signals CL and $\overline{CL}$ control shifting of the frequency to gate 44 and latch 20. From gate 44 the frequency will have a pulse width precisely related to the clock signal. This frequency is provided to inverting pulse shaper amplifier 46 at a repetition rate equated to the frequency from the binary counter means. There is therefore provided at pin 48 negative going pulse similar to the negative going pulse provided to switch 34 and in synchronous relationship therewith.

In one operative environment of my invention that has been realized, such as a watch circuit, the pin 36 is to provide a time source for a decoder driver that is powered by a DC-DC converter connected to pin 48 in accordance with the detector circuit.

As those skilled in the art can readily appreciate the foregoing is only one embodiment of my invention that has been illustrated to explain the manner of construction that may be employed. What is intended to be covered by these Letters Patent is expressed by the appended claims.

I claim:

1. A means to control pulse width and repetition rate comprising:

a shift register having first and second clock signal inputs and a pulse signal input and two outputs a latch means connected to one of said two (outputs of said shift register such that a signal from said one of said two outputs of said shift register will reset said latch means, said latch means also having means to receive a signal to set said latch means;

a first gate means connected to said latch means to receive an output signal of said latch said first gate means comparing said output signal of said latch means with another frequency signal for generating a pulse signal, said first gate means being connected to said shift register to deliver said pulse signal to said pulse signal input of said shift register; and a second gate means having multiple inputs at least one of which receives one of said first and second clock signals and another of which receives said one of said two outputs of said shift register connected to said latch means whereby a pulse of precise width and of a controlled repitition rate is provided at the output of said second gate means.

2. The structure of claim 1 wherein said shift register receives both a CL and a $\overline{CL}$ signal and said second gate means receives only the CL signal.

3. The structure of claim 1 wherein the first and second gates are NAND gates.

4. The structure of claim 1 wherein the first gate is a NAND gate and the second gate is a NOR gate.

5. The structure of claim 4 wherein a third gate is connected between a power source signal and a frequency signal to deliver a set signal to said latch.

6. The structure of claim 5 wherein said third gate is a NOR gate.

7. The structure of claim 1 wherein an electronic switch is connected between said second gate a power source and an output terminal for said circuit.

8. For use with an oscillator controlled binary counter means a circuit to lower power dissipation by refining pulse width and its repetition rate in delivery of a timing source signal and a power supply to a decoder driver means for powering a display, said circuit comprising:

a first gate receiving an output frequency signal from the binary counter means and having an output connection;

a first shift register connected to said output connection of said first gate, said first shift register having additional inputs for clock pulses, CL, $\overline{CL}$ for the binary counter means whereby said first shift register can deliver an output signal;

a second gate connected to the first shift register to receive the output of said first shift register, said second gate having another input connected to the CL portion of the clock pulses CL, $\overline{CL}$ for the binary counter means;

a first latch means connected to an output frequency of the binary counter means to set said first latch means, said first latch means being also connected to the output of said first shift register to reset said first latch means, said first latch means having an output connected to deliver an output frequency to said first gate to in combination with the output frequency signal of the binary counter means control said first gate whereby said second gate has an output pulse of precise width and a repitition rate equated to said clock pulses CL, $\overline{CL}$ for the binary counter means;

a third gate connected the binary counter means to receive a frequency signal therefrom of higher order than the output frequency signal of the binary counter means supplied to said first gate;

a second shift register connected to an output of said third gate and to the clock pulses CL, $\overline{CL}$ provided at inputs to said first shift register to be coordinated therewith, said second shift register having two outputs;

a second latch means connected to one of said two outputs of said second shift register to reset same in accordance therewith, said second latch means having an output frequency connection to said third gate;

a fourth gate connected to the frequency input to said third gate and having an input from an asynchronous signal source to set said second latch whereby said third gate a pulse signal of a refined width to said second shift register;

a fifth gate connected to the second of the two outputs of said shift register and having another input connected to the $\overline{CL}$ clock pulse for said second means) shift register;

a switch connected to said second gate means and a power supply to provide a timing source signal having a precise pulse width and repetition rate; and an inverter means connected to said fifth gate to provide a power supply signal coordinated to said timing source signal.

* * * * *